United States Patent [19]

Homma et al.

[11] Patent Number: 4,564,416
[45] Date of Patent: Jan. 14, 1986

[54] METHOD FOR PRODUCING A SEMICONDUCTOR DEVICE

[75] Inventors: Kazumoto Homma, Sagamihara; Masaharu Watanabe, Yokosuka, both of Japan

[73] Assignees: Toshiba Ceramics Co., Ltd., Tokyo; Tokyo Shibaura Denki Kabushiki Kaisha, Kawasaki, both of Japan

[21] Appl. No.: 328,685

[22] Filed: Dec. 8, 1981

Related U.S. Application Data

[62] Division of Ser. No. 169,460, Aug. 16, 1980, abandoned.

[51] Int. Cl.$^4$ .............................................. C30B 33/00
[52] U.S. Cl. ...................... 156/617 SP; 156/DIG. 73
[58] Field of Search ............... 156/601, 603, DIG. 73, 156/617 SP, 612, 624; 148/1.5, 189, 191; 427/86

[56] References Cited

U.S. PATENT DOCUMENTS

| | | | |
|---|---|---|---|
| 3,441,385 | 4/1969 | Schmidt | 357/88 |
| 3,976,512 | 8/1976 | De Nora et al. | 357/88 |
| 3,997,368 | 12/1976 | Petroff et al. | 148/175 |
| 4,018,626 | 4/1977 | Schwuttke et al. | 148/175 |
| 4,069,068 | 1/1978 | Beyer et al. | 357/88 |
| 4,116,719 | 9/1978 | Shimizu et al. | 357/88 |
| 4,314,595 | 2/1982 | Yamamoto | 156/DIG. 73 |

OTHER PUBLICATIONS

Cazcarra et al., *J. Appl. Phys.*, 51(8), 8/80, pp. 4206–4211.
Fuller et al., *Jl. of Applied Physics*, vol. 28, No. 12, 12/57.
ANSI/ASTM F 121-79, 1979, pp. 519–521.
Katz et al., *J. Electrochem. Soc. Solid State Science and Technology*, vol. 125, No. 7, 7/78, pp. 1151–1155.
Tan et al., *Applied Physics Letters*, vol. 30, No. 4, Feb. 15, 1977, pp. 175–176.
Freeland et al., *Applied Physics Letters*, vol. 30, No. 1, Jan. 1, 1977, pp. 31–33.

*Primary Examiner*—Hiram H. Bernstein
*Attorney, Agent, or Firm*—Oblon, Fisher, Spivak, McClelland & Maier

[57] ABSTRACT

A method of producing a semiconductor device comprising a semiconductor substrate exhibiting defect density of $10^5/\text{cm}^2$ or more when the central portion of the substrate is observed through an optical microscope after the substrate is heat-treated at 1,050° C. for 18 hours and etched along a section thereof across the thickness thereof.

7 Claims, 7 Drawing Figures

METHOD FOR PRODUCING A SEMICONDUCTOR DEVICE

This is a division of application Ser. No. 169,460, filed Aug. 16, 1980 and now abandoned.

BACKGROUND OF THE INVENTION

This invention relates to a semiconductor device and a method for manufacturing the same, more specifically to a semiconductor device including a semiconductor substrate with controlled defect density and a method for manufacturing the same.

Bipolar devices are typical semiconductor devices in which an epitaxial layer is formed on a semiconductor substrate. A bipolar device may be manufactured in processes as shown in FIGS. 1A to 1C. First, the specular-ground surface of a P-type single-crystal silicon substrate 1 shown in FIG. 1A is oxidized to form an oxide layer 2, and a predetermined portion of the oxide layer 2 is removed by photolithography, as shown in FIG. 1B. Then, antimony is selectively diffused in the exposed surface of the silicon substrate to a given depth at a temperature of e.g. 1,250° C. to form an N-type region 3. Subsequently, the oxide layer 2 is removed by using hydro-fluoric acid, and then an epitaxial layer 4 is grown over the substrate 1 by hydrogen reduction of silicon tetrachloride, as shown in FIG. 1C.

In the epitaxial layer 4 formed in the aforementioned manner, there usually exist defect called stacking faults 5. The density of the stacking faults 5 varies within a wide range of $3/cm^2$ to $1,000/cm^2$. Generally, if contaminations such as Fe and Cu exist in the single-crystal substrate 1, or if such contaminations are induced during an epitaxial growth step including a diffusion step, then the density of stacking faults 5 will increase with the contamination which will be nuclei 7 of the stacking faults. The density of these stacking faults should be minimized since they may exert a great influence on the manufacturing yield and electrical properties of the semiconductor device.

In order to prevent the occurrence of the stacking faults, there are proposed several cleaning methods. According to one of these methods, the purity of the atmosphere during the epitaxial growth step including the diffusion step is improved. According to another method, the oxygen concentration of the substrate 1 is increased. Although the former method or the improvement of the purity of the atmosphere during the manufacturing step is attempted frequently, it is very difficult to achieve a marked improvement at once. The latter method or the attempt to prevent the occurrence of stacking faults by increasing the oxygen concentration of the substrate, which appears in *J. Electrochem. Soc.* 125, 1151 (1978); L. E. Katz and D. W. Hill, can be regarded as highly effective. This method, however, has the following two problems. First, if the number of revolutions is increased to increase the oxygen concentration in growing the single crystal by Czochralski method, then dislocation will be liable due to the vibration of molten silicon surface, etc. Secondly, the oxygen concentration distribution in the single crystal will not be uniform along the longitudinal direction (direction of growth). Namely, the oxygen segregation coefficient k at the solid-liquid interface of silicon is 1.2–higher than 1. Therefore, the oxygen concentration is high on the seed side (head side) of the single crystal, though it is low on the opposite side. Table 1 shows an example of measurement of the oxygen concentration on the head and tail sides of the single crystal. This measurement is made by infrared absorption method, and the oxygen concentration is obtained as $\Delta\alpha \times 2.6 \times 10^7/cm^3$ ($\Delta\alpha$ is increment of infrared absorption coefficient attributable to oxygen).

TABLE 1

| | oxygen concentration ($/cm^3$) | |
|---|---|---|
| Sample No. | head side | tail side |
| 1 | $11.4 \times 10^{17}$ | $7.8 \times 10^{17}$ |
| 2 | $11.1 \times 10^{17}$ | $8.3 \times 10^{17}$ |
| 3 | $11.6 \times 10^{17}$ | $8.6 \times 10^{17}$ |

As is evident from Table 1, the single crystal can have high oxygen concentration only at the head-side portion, so that the occurrence of stacking faults can be prevented only at such portion. According to an experiment conducted by the inventors hereof, the portion of the single crystal exhibiting high oxygen concentration and hence suffering less stacking faults, which was found only on the head side, proved to account for 20% of the whole single crystal in volumne.

SUMMARY OF THE INVENTION

The object of this invention is to provide a high-yield semiconductor device relieved of any adverse effect of contaminations mixed therewith in the course of manufacturing process and a method for manufacturing the same.

According to this invention, there is provided a semiconductor device comprising a semiconductor substrate exhibiting defect density of $10^5/cm^2$ or more when the central portion of the substrate is observed through an optical microscope after the substrate is heat-treated at 1,050° C. for 18 hours and etched along a section thereof across the thickness thereof.

Furthermore, according to this invention, there is provided a method for manufacturing a semiconductor device comprising a process for producing crystal defects of density of $10^5/cm^2$ or more in a semiconductor substrate by heat-treating the semiconductor substrate at a temperature of 600° C. to 900° C.

DETAILED DESCRIPTION OF THE PREFERRED EMBODIMENT

Now this invention will be described in detail with reference to the accompanying drawings.

Figure 1A:
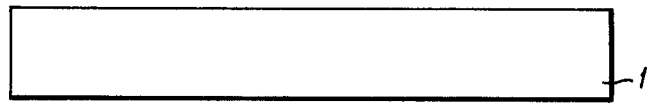
FIGS. 1A to 1C are partial sectional views showing processes for forming an epitaxial layer of a prior art bipolar device.
Figure 1B:
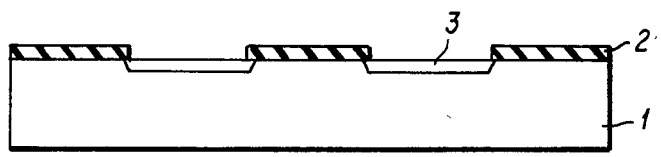
Figure 1C:
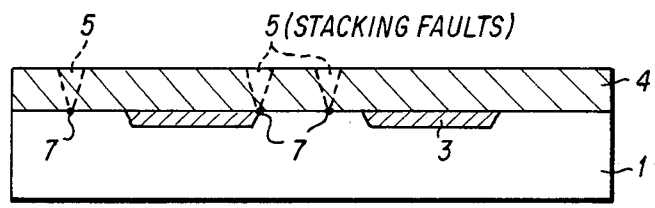
Figure 2:
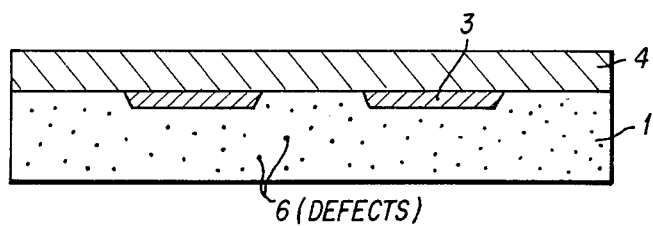
FIG. 2 is a partial sectional view of a semiconductor device according to an embodiment of this invention.

FIG. 2 is a sectional view of a bipolar semiconductor device according to an embodiment of this invention. In FIG. 2, an N-type diffusion region 3 is formed at a predetermined portion of the surface of a P-type substrate 1, and an epitaxial layer 4 is formed over the whole surface of the substrate 1. In the substrate 1 exist crystal defects 6 with density of $10^5/cm^2$ or more. In this invention, the defect density, which may somewhat vary with the method of measurement, is obtained by cleaving the substrate across its thickness after subjecting it to 18-hour heat treatment in nitrogen atmosphere at a temperature of 1,050° C., etching the section of the substrate by using e.g. Wright etchant for 90 seconds, and observing the central portion of the substrate through an optical microscope. According to the microscopic observation, each crystal defect is in the form of a pit with a round bottom. Hereinafter, therefore, the crystal defects 6 will be referred to as shallow pits.

It was found that the shallow pits 6 have a close connection with stacking faults produced in the epitaxial layer. An experiment revealed that the number of stacking faults in the epitaxial layer may be limited to a permissible level when the number of shallow pits per unit area or the defect density is $10^5/cm^2$ or more.

Figure 3:
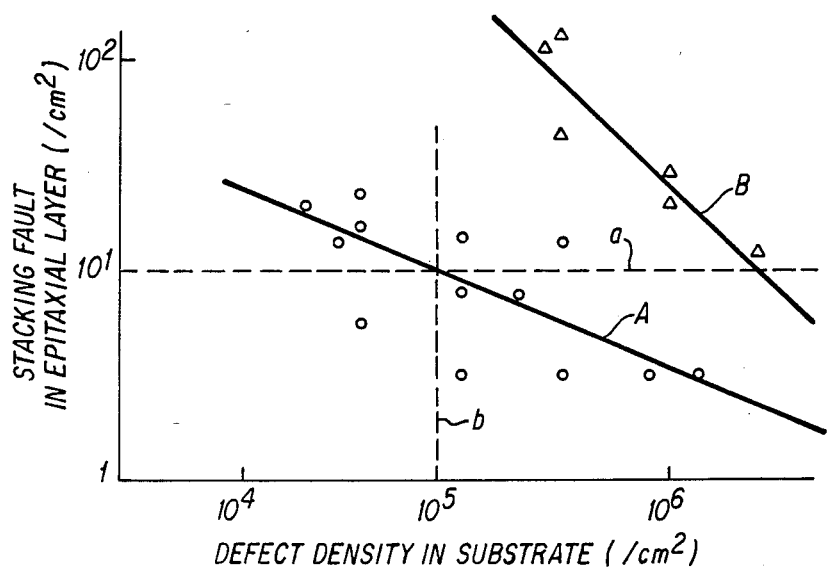
FIG. 3 is a graph showing the relationship between the defect density of the semiconductor substrate and the number of stacking faults in the epitaxial layer.

FIG. 3 is a graph showing the relationship between the defect density of the substrate and the stacking fault density of the epitaxial layer formed on the surface of the substrate. In the graph of FIG. 3, circles represent experimental values obtained in normal cleaning, while triangles represent experimental values obtained in a somewhat contaminated process. Although subject more or less to variations, these experimental values may substantially be approximated to straight lines A and B, respectively. As may be seen from the straight lines A and B, the stacking faults in the epitaxial layer decrease as the shallow pits increase in either case. In general, the maximum allowable stacking fault density of the epitaxial layer is $10/cm^2$, so that, in conducting an epitaxial growth process in normal cleaning, the defect density need only be limited to the right side of a straight line perpendicular to the axis of abscissa and passing through the intersection of a broken line a and the straight line A, that is, approximately $10^5/cm^2$ or more.

Thus, it was confirmed experimentally that the stacking fault density of the epitaxial layer becomes lower than $10/cm^2$ when the defect density is higher than $10^5/cm^2$. This phenomenon may be attributed to the following reason. If crystal defects exceeding a given number exist in the substrate, contaminations are gettered by the crystal defects in the substrate in conducting an epitaxial growth process including a diffusion step, so that the nuclei of the stacking faults in the epitaxial layer are removed, and thus the occurrence of stacking faults is prevented. The 18-hour heat treatment of the substrate involving crystal defects at 1,050° C. is intended to enlarge the crystal defects in the substrate into shallow pits of observable size.

Now there will be described a method for manufacturing the above-mentioned semiconductor substrate with defect density of $10^5/cm^2$ or more.

In this invention, the crystal defects in the semiconductor substrate are produced by treating the semiconductor substrate, which may have oxygen concentration of e.g. $10 \times 10^{17}/cm^2$ or less, by low-temperature heating at 600° C. to 900° C. in an oxidizing or non-oxidizing atmosphere. The low-temperature heat treatment may be conducted for the semiconductor substrate prior to a manufacturing process for the semiconductor device such as a diffusion process, or may be replaced by heat treatment during a manufacturing process precedent to the diffusion process.

Figure 4:
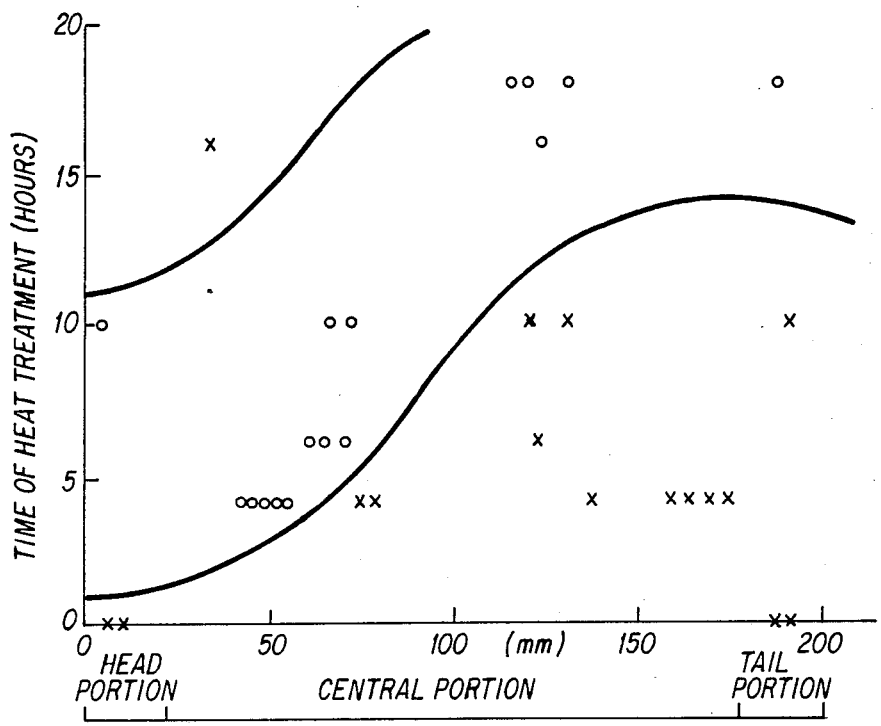
FIG. 4 is a graph showing the relationship between the positions of several portions of a single crystal obtained by pulling method and the time of heat treatment.

The graph of FIG. 4 shows the relationship between sample positions of a single crystal and the time of heat treatment in a case where substrate samples are prepared from various portions of the single crystal with head-side oxygen concentration of $1.0 \times 10^{18}/cm^3$ and tail-side oxygen concentration of $6.7 \times 10^{17}/cm^3$, and is heat-treated at 800° C. for 0 to 18 hours, and then epitaxial layers are formed. In FIG. 4, the axes of ordinate and abscissa represent the time of heat treatment and the sample position of single crystal, respectively. Circles and crosses indicate cases where the stacking fault density of the epitaxial layer is not higher and higher than $10/cm^2$, respectively.

The graph of FIG. 4 tells that a substrate prepared from the head-side portion of the single crystal has stacking fault density of epitaxial layer of $10/cm^2$ or less when the time of heat treatment is 1 to 11 hours, and that a substrate prepared from the central portion of the single crystal has stacking fault density of $10/cm^2$ or less when the time of heat treatment is 14 hours or more. On the other hand, when the time of heat treatment is 0, that is, when the heat treatment is not conducted, the stacking fault density of a substrate prepared from the whole portion of the single crystal from the head side to the tail side exceeds $10/cm^2$. Also, when the substrate formed of the head-side portion of the single crystal has stacking fault density exceeding $10/cm^2$ when it is subjected to excessive heat treatment exceeding 11 hours. This implies that stacking faults are produced in the substrate by the prolonged low-temperature heat treatment at 800° C., arousing stacking faults in the epitaxial layer. When a substrate corresponding to a circle in FIG. 4 was heat-treated at 1,050° C. for 18 hours, and a section of the substrate across its thickness was etched and observed through an optical microscope, the density of shallow pits or the defect density was found to be more than $10^5/cm^2$. When a substrate corresponding to a cross was treated in the same manner, the defect density was found to be only $10^3$ to $10^4/cm^2$.

As may be seen from the above description, in forming an epitaxial layer on a substrate which exhibits defect density of $10^5/cm^2$ or more when the central portion of the substrate, after heat-treated at 1,050° C. for 18 hours and etched along the section across its thickness, is observed through an optical microscope, the density of stacking faults aroused in the epitaxial layer can be limited to $10/cm^2$ or less.

According to this invention, the defect density can be increased without increasing the oxygen concentration by heat-treating the semiconductor substrate at a low temperature of 600° C. to 900° C. The reason for this is given below.

Figure 5:
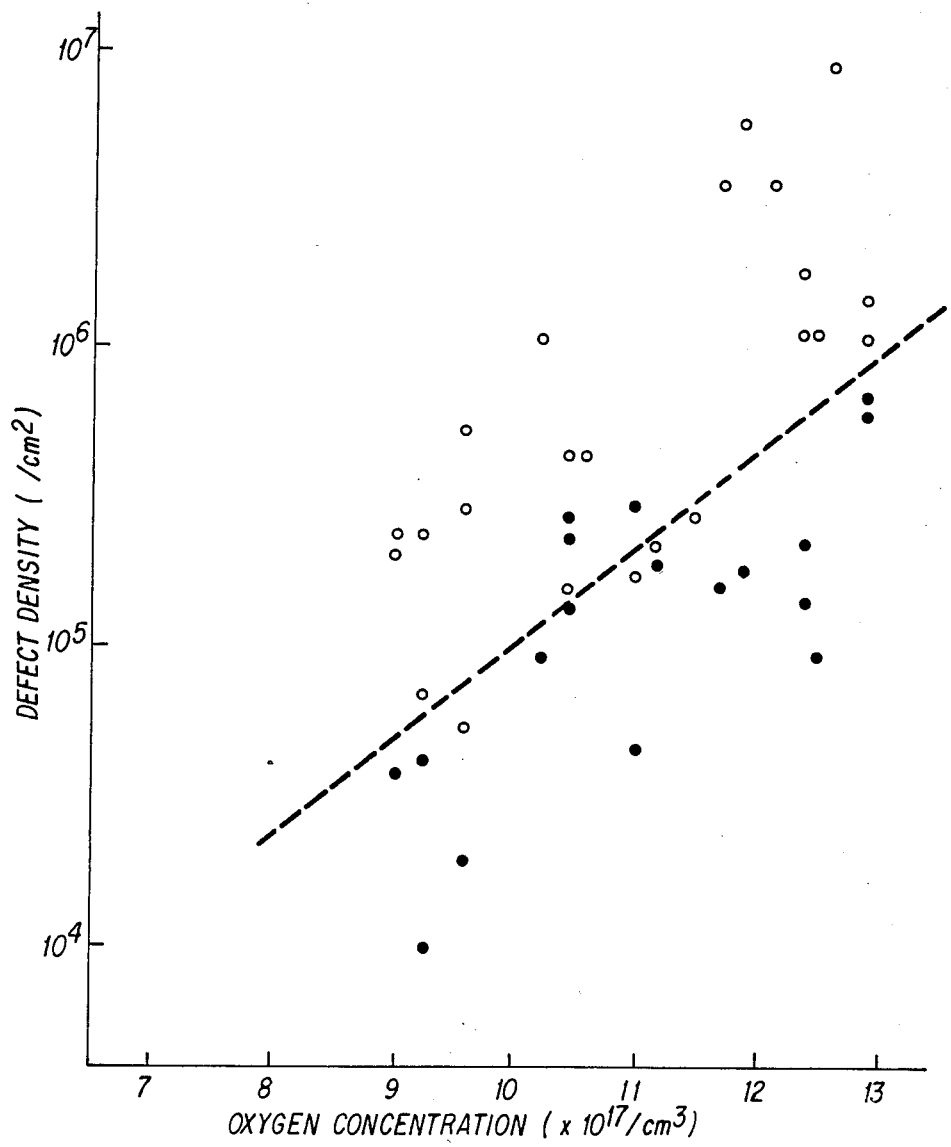
FIG. 5 is a graph showing the relationship between the defect density and oxygen concentration of the semiconductor substrate.

FIG. 5 is a graph showing the relationship between the oxygen concentration and defect density of the semiconductor substrate. In this graph, black spots represent microscopic measurement results obtained from a substrate heat-treated at 1,050° C. for 18 hours and etched, without undergoing low-temperature heat treatment at 600° C. to 900° C., while circles represent microscopic measurements obtained from a substrate heat-treated at 1,050° C. for 18 hours after being subjected to low-temperature heat treatment at 800° C. for 6 hours and etched. As is evident from FIG. 5, the defect density increases as the oxygen concentration increases, though it is increased by low-temperature heat treatment even with the same oxygen concentration. This implies that the oxygen concentration can be lowered by using low-temperature heat treatment in obtaining uniform defect density. For example, although defect density of $10^5/cm^2$ requires average oxygen concentration of $11 \times 10^{17}/cm^2$ without the low-temperature heat treatment, the same defect density can be obtained with use of oxygen concentration of approximately $9 \times 10^{17}/cm^2$ after 4 hours of low-temperature heat treatment at 800° C. Also, a substrate was subjected to low-temperature heat treatment at 650° C. for 24 hours. In this case, defect density of $10^5/cm^2$ was obtained with use of oxygen concentration of approximately $7 \times 10^{17}/cm^2$.

In the semiconductor device of this invention in which an epitaxial layer is formed on the surface of a semiconductor substrate with defect density of $10^5/cm^2$ or more, as described above, occurrence of stacking faults in the epitaxial layer can be prevented without increasing the oxygen concentration of the substrate.

Although there has been described a case where this invention is applied to a semiconductor device including an epitaxial layer, it is to be understood that the invention is not limited to such case and may be applied to all the semiconductor devices that use semiconductor substrates, such as MOS IC, LSI, etc. Now there will be briefly described a dynamic random access memory (d-RAM) as an example of MOS IC.

16k-bit d-RAM's were manufactured by using a semiconductor substrate subjected to low-temperature heat treatment according to this invention and a semiconductor substrate without such low-temperature heat treatment, and their yields were examined and compared by a die sort test. The results are shown in Table 2.

TABLE 2

| Test No. | Yield | |
|---|---|---|
| | No heat treatment | Heat-treated |
| 1 | 48.1% | 52.6% |
| 2 | 90.3% | 96.4% |

In Table 2, test No. 1 is a test item for the examination of a reduction in yield due to an increase of leak current at PN junction in the die sort test, and test No. 2 is a test item for the examination of variation in yield related to the lifetime of minority carrier in the semiconductor substrate in the die sort test. The heat treatment was conducted in oxygen at 800° C. for 4 hours. As is evident from Table 2, higher yield is obtained with use of low-temperature heat treatment for both test Nos. 1 and 2. The probable reason lies in that crystal defects in the substrate formed by low-temperature heat treatment gettered contaminations induced during the manufacturing process.

The low-temperature heat treatment of this invention has the same effect on an ingot of single crystal, a semiconductor substrate in the middle of the manufacturing process therefor, and a mirror wafer.

What we claim is:

1. A method for manufacturing a semiconductor device comprising the steps of:
    heat-treating a semiconductor substrate at a temperature of 600° C. to 900° C. for a predetermined period of time necessary to produce crystal defects of density of at least $10^5/cm^2$ in said substrate; and
    forming an epitaxial layer on said substrate wherein said epitaxial layer has a reduced stacking fault density due to said crystal defect density of at least $10^5/cm^2$ in said substrate.

2. A method for manufacturing a semiconductor device comprising a process for producing crystal defects of density of $10^5/cm^2$ or more in a semiconductor substrate by heat-treating said semiconductor substrate at a temperature of 600° C. to 900° C., wherein said semiconductor substrate is formed of a tail portion of a single crystal prepared by a pulling method, and the time of said heat treatment is 8 to 20 hours.

3. A method according to claim 2, wherein said semiconductor substrate has an oxygen concentration of at most $10 \times 10^{17}/cm^2$ before said heat treatment.

4. A method according to claim 2 further comprising a process for forming an epitaxial layer on the surface of said semiconductor substrate.

5. A method for manufacturing a semiconductor device comprising a process for producing crystal defects of density of $10^5/cm^2$ or more in a semiconductor substrate by heat-treating said semiconductor substrate at a temperature of 600° C. to 900° C., wherein said semiconductor substrate is formed of a head portion of a single crystal prepared by a pulling method, and the time of said heat treatment is 1 to 11 hours.

6. A method according to claim 5, wherein said semiconductor substrate has an oxygen concentration of at most $10 \times 10^{17}/cm^2$ before said heat treatment.

7. A method according to claim 5 further comprising a process for forming an epitaxial layer on the surface of said semiconductor substrate.

* * * * *

UNITED STATES PATENT AND TRADEMARK OFFICE
CERTIFICATE OF CORRECTION

PATENT NO. : 4,564,416

DATED : January 14, 1986

INVENTOR(S) : Kazumoto Homma, et al.

It is certified that error appears in the above-identified patent and that said Letters Patent is hereby corrected as shown below:

Title page:

-- The priority information in the Letters Patent has been omitted. Please add the following priority information:

July 23, 1979    Japan        54-92579 --

Signed and Sealed this

Twenty-ninth Day of July 1986

[SEAL]

Attest:

DONALD J. QUIGG

Attesting Officer

Commissioner of Patents and Trademarks